(12) United States Patent
Renavikar et al.

(10) Patent No.: US 7,485,495 B2
(45) Date of Patent: Feb. 3, 2009

(54) INTEGRATED HEAT SPREADER WITH INTERMETALLIC LAYER AND METHOD FOR MAKING

(75) Inventors: Mukul P. Renavikar, Chandler, AZ (US); Susheel G. Jadhav, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/625,416

(22) Filed: Jan. 22, 2007

(65) Prior Publication Data

US 2007/0117270 A1    May 24, 2007

Related U.S. Application Data

(62) Division of application No. 11/094,893, filed on Mar. 30, 2005, now Pat. No. 7,183,641.

(51) Int. Cl.
  *H01L 21/00* (2006.01)
(52) U.S. Cl. .................. 438/122; 257/E23.08
(58) Field of Classification Search .................. 438/122
  See application file for complete search history.

(56) References Cited

U.S. PATENT DOCUMENTS

| | | |
|---|---|---|
| 5,354,717 A | 10/1994 | Pollock et al. |
| 5,587,882 A | 12/1996 | Patel |
| 5,926,371 A | 7/1999 | Dolbear |
| 5,931,222 A | 8/1999 | Toy et al. |
| 6,008,536 A | 12/1999 | Mertol |
| 6,462,410 B1 | 10/2002 | Novotny et al. |
| 6,504,243 B1 | 1/2003 | Andric et al. |
| 6,518,666 B1 | 2/2003 | Ikeda |
| 6,656,770 B2 | 12/2003 | Atwood et al. |
| 6,724,078 B1 | 4/2004 | Sur et al. |
| 6,748,350 B2 | 6/2004 | Rumer et al. |
| 6,790,709 B2 | 9/2004 | Dias et al. |
| 6,867,978 B2 | 3/2005 | Whittenburg et al. |
| 6,924,170 B2 | 8/2005 | Ravi et al. |
| 2001/0026957 A1 | 10/2001 | Atwood et al. |
| 2003/0117343 A1 | 6/2003 | Kling |
| 2004/0190263 A1 | 9/2004 | Jadhav et al. |
| 2005/0040518 A1 | 2/2005 | Brandenburg et al. |

*Primary Examiner*—Lex Malsawma
(74) *Attorney, Agent, or Firm*—Schwabe, Williamson & Wyatt, P.C.

(57) ABSTRACT

Integrated heat spreader and die coupled with solder in a manner forming an intermetallic compound having a higher liquidus temperature than the liquidus temperature of the solder used to create the intermetallic compound are described herein.

17 Claims, 4 Drawing Sheets

INTEGRATED HEAT SPREADER WITH INTERMETALLIC LAYER AND METHOD FOR MAKING

RELATED APPLICATIONS

The present application is a divisional of U.S. patent application Ser. No. 11/094,893, filed Mar. 30, 2005, now U.S. Pat. No. 7,183,641, and entitled "INTEGRATED HEAT SPREADER WITH INTERMETALLIC LAYER AND METHOD FOR MAKING," which is hereby incorporated by reference in its entirety.

TECHNICAL FIELD

Embodiments of the present invention relate to, but are not limited to, electronic devices and, in particular, to the field of electronics packaging. More specifically, the present invention relates to bonding integrated heat spreaders to a die with an intermetallic layer.

BACKGROUND

The current trend in electronics is to make electronic devices with smaller components operating at higher clock frequencies and power levels generating more and more heat. These components include electronic packages such as microprocessor and memory packages. The electronic packages typically include a die that is usually mounted onto a supporting substrate sometimes referred to as a carrier or package substrate ("substrate"). The electronic package, in turn, is typically physically and electrically coupled to a printed circuit board (PCB). The die and the substrate are typically made of multiple ceramic or silicon layers. The heat generated by such electronic packages can increase.

One common approach to draw the heat away from the die includes the use of an Integrated Heat Spreader (IHS) as a lid in thermal contact with the die. To ensure thermal coupling between the IHS and the die a Thermal Interface Material (TIM) is used. The TIM can comprise a variety of materials.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention.

The following description may include terms such as on, onto, on top, underneath, underlying, downward, lateral, and the like, that are used for descriptive purposes only and are not to be construed as limiting. That is, these terms are terms that are relative only to a point of reference and are not meant to be interpreted as limitations but are instead included in the following description to facilitate understanding of the various aspects of the invention.

The phrase "in one embodiment" is used repeatedly. The phrase generally does not refer to the same embodiment; however, it may.

The terms "comprising", "having" and "including" are synonymous, unless the context dictates otherwise.

The terms "Integrated Heat Spreader", "IHS", "lid", and "IHS lid" are synonymous, unless the context dictates otherwise.

The terms "high remelting temperature phas metal compounds", "intermetallic compounds", and "IMC" are synonymous, unless the context dictates otherwise.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation. In addition, one or more of the operations may be eliminated while other operations may be added in different embodiments of the invention.

Figure 1:
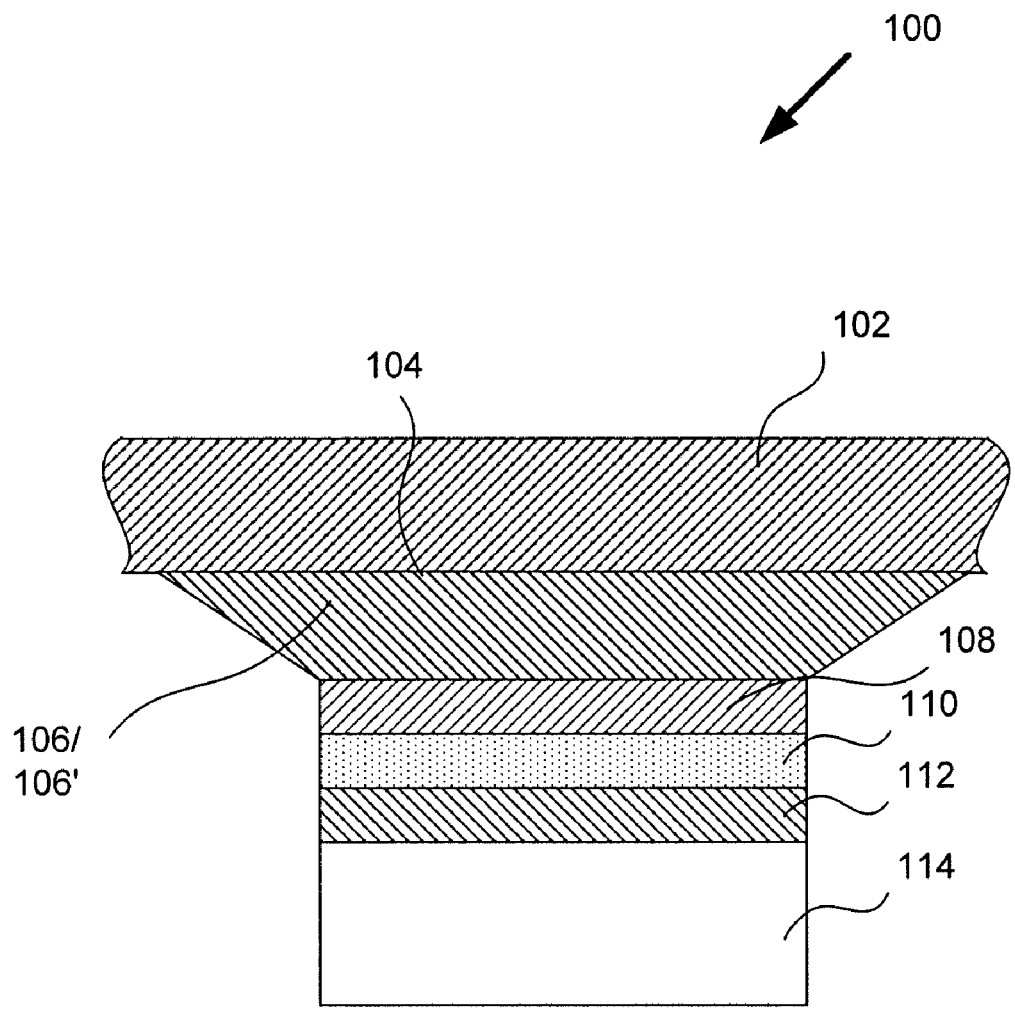
FIG. 1 illustrates a cross-sectional representation of a solderable thermal interface between a die and a lid or integrated heat spreader, in accordance with one embodiment of the invention.

As will be described below in detail, FIG. 1 depicts a cross sectional representation of a portion of a die 114 and an integrated heat spreader 102 according to one embodiment. The integrated heat spreader 102 is attached to the back surface of the die using a suitably solderable thermal interface material 106 that becomes an intermetallic compound 106' when reacted with a die side 104 of the IHS 102. In order to reduce thermal stresses in the package that can be generated by relatively high heat (e.g. greater than 200 degrees Celsius) a solderable thermal interface material 106 is selected that has a relatively low melting point (e.g. less than 200 degrees Celsius). In contrast, the intermetallic compound 106' will have a higher melting point than the original solderable thermal interface material 106. Typically, sufficiently high to provide a desired operational reliability margin. This enables the die to be mounted to a substrate using a suitable solder material that has a low melting point similar to that used for the solderable thermal interface material 106 during a solder reflow process without the IHS 102 detaching from the die 114. By reducing thermal stresses throughout the assembly process, the die 114 is less likely to experience warpage when it is subjected to heat.

Referring now in detail to FIG. 1, as described earlier, an IHS/die assembly 100 is illustrated according to one embodiment. For improved solderability of the thermal interface material 106 to the die 114, one or more metal layers 112, 110, and 108 are deposited on a first side of the die (the IHS side) that is to be coupled via thermal interface material 106 to the IHS 102. In various embodiments, before deposition of the one or more metal layers 112, 110, and/or 108, the wafer surface can be prepared with a sputter etch, if desired, to improve the adhesion of the adhesion layer 112 to the die surface. However, in alternate embodiments, the wafer surface may be in unpolished, polished, or background form.

Next, for the embodiments, an adhesion layer 112 of a metal such as titanium (Ti), may be deposited onto the etched surface. Adhesion layer 112 may be deposited by any number of suitable deposition methods, including sputtering, plating, vapor deposition or e-beam. In one embodiment, an approximate 500 Angstrom layer of titanium (Ti) is sputtered onto the etched surface. In alternate embodiments, Chromium (Cr), vanadium (V), and possibly zirconium (Zr) could be substituted for Ti.

Next, for the embodiments, a diffusion layer 110 of e.g. metal, may be deposited. In various embodiments, the metal may be nickel-vanadium (NiV). In one embodiment, an approximate 3500 Angstrom layer of NiV may be sputtered onto the Ti layer. The diffusion layer 110 may serve as a diffusion barrier to prevent reaction of solder in the thermal interface material 106 with the adhesion layer 112. Such reaction could result in possible delamination of the thermal interface material 106 from the die 114. In alternate embodiments, IHS/die assembly 100 may be formed without diffusion layer 110.

Next, for the embodiments, a wetting layer 108 of e.g. a metal, can be deposited. In various embodiments, the metal may be gold (Au), In one embodiment, a 600 Angstrom layer of Au is sputtered onto the NiV layer. In alternate embodiments, other metals that can "wet" the chosen solder material in the thermal interface material 106 can be substituted for gold. Nickel is one example.

In one embodiment, IHS 102 comprises copper (Cu). In another embodiment, IHS 102 comprises aluminum-silicon-carbide (AlSiC) with a copper plating (not shown) on the die side of the IHS 102. In yet another embodiment, IHS 102 comprises a graphite material with a copper plating on the die side 104 of the IHS 102. In various embodiments, a plated metal layer suitable for creating the desired intermetallic compound 106' with the solderable TIM 106 may be used on the die side of the IHS 102 to facilitate wetting. In various embodiments, the material may be copper. Experience has shown that the employment of copper enables a wide range of IHS 102 having suitable thermal dissipation characteristics to be used. Further, experience has shown that copper reacts much more quickly than nickel with the indium (In) or tin (Sn) in the solder, and at much lower temperatures (compared to other metals), to create the intermetallic compounds 106'. Additionally, for an embodiment where the IHS 102 comprises copper, plating process for the IHS 102 may be eliminated to further decrease cost and time in the production cycle.

Table 1 lists a number of solder material suitable as is, or in combination with one another, to form the TIM 106. The materials are commercially available from e.g. Indium Corporation of America, Utica, N.Y., under the corresponding Indalloy. RTM. No.

TABLE 1

| Composition | Liquidus (degree. C.) | Solidus (.degree. C.) | Thermal Conductivity Watts/Meter .degree. C. | Indalloy No. |
| --- | --- | --- | --- | --- |
| 308% Bismuth (Bi)/ 42% Tin (Sn) | 138 | 138 | 19 | 281 |
| 97% Indium (In)/ 3% Silver (Ag) | 143 | 143 | 73 | 290 |
| 80% In/15% Lead (Pb)/5% Ag | 1302 | 149 | 43 | 2 |
| 100% In | 1320 | 1320 | 86 | 4 |

In various embodiments, for improved solderability of the thermal interface material 106 to the die side 104 of the IHS, the die side 104 may be chemically cleaned by any suitable chemical process.

The thermal interface material 106 can be deposited on either the die side 104 of the IHS 102 or/and on the metallic layer 108/110/112 of the die 114 by any suitable process, for example sputtering, vapor deposition, electro-plating, electroless plating or other known deposition methods.

Figure 2:
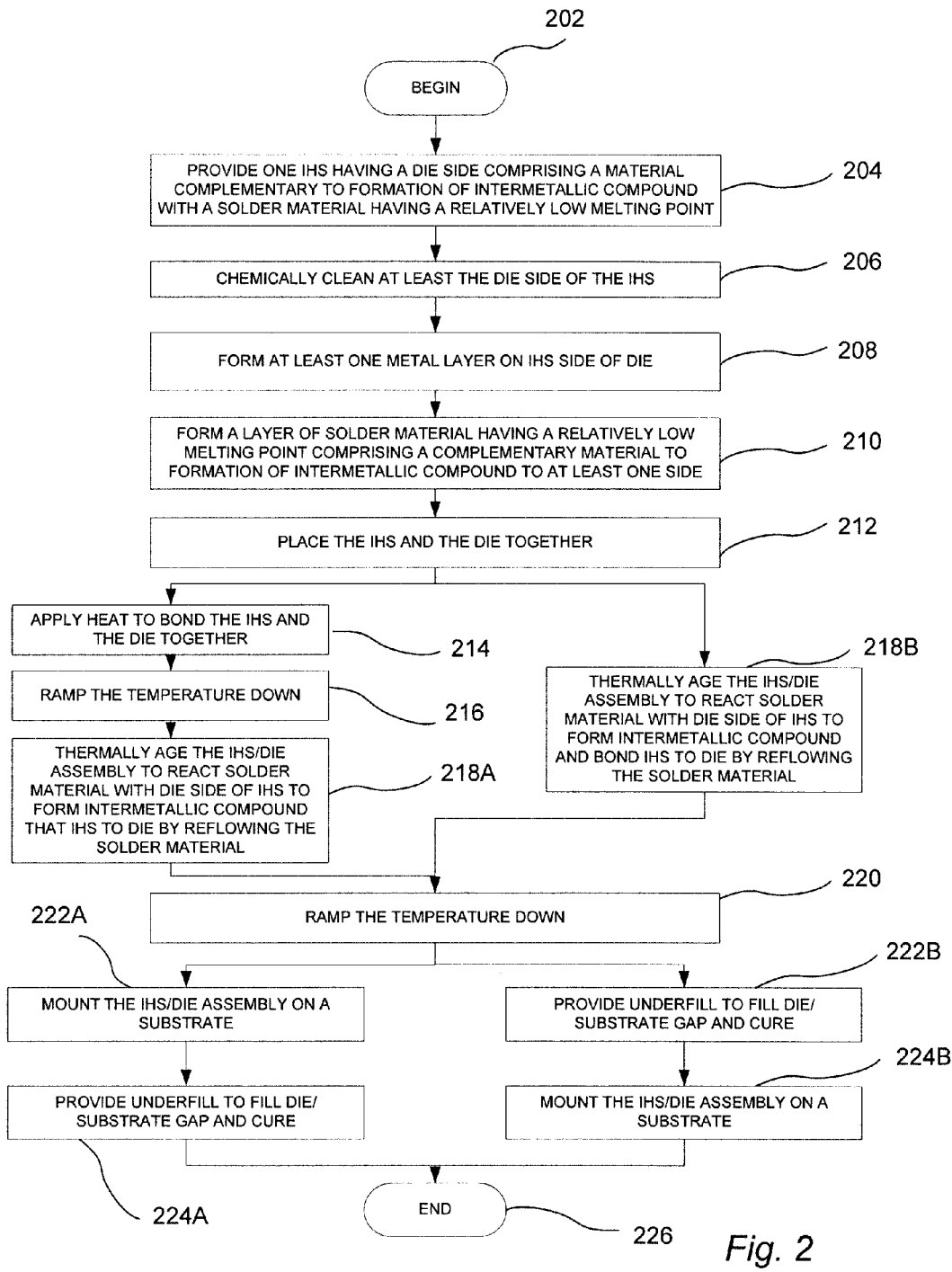
FIG. 2 illustrates a flow diagram of a method of packaging a die, in accordance with one embodiment of the invention.

FIG. 2 illustrates a flow diagram of a suitable method of packaging the die 114 as illustrated in FIG. 1, in accordance with one embodiment of the invention. At 202, the process begins. At process point 204, an IHS lid is to be provided. The die side of the IHS comprises a complementary material suitable for the formation of an intermetallic compound with a solderable TIM that has a relatively low melting point (compared to other solder materials). In one embodiment, the complementary material is copper.

Next, for the embodiments, at 206, the die side of the IHS lid may be chemically cleaned to facilitate bonding with the solderable TIM.

Next, for the embodiments, at 208, at least one metal layer on the IHS side of the die may be formed to serve as an adhesion layer.

Next, for the embodiments, at 210, a fluxless capable solderable TIM layer is deposited on either the die side of the IHS lid or on the metal layer of the die.

Next, for the embodiments, at 212, the die side of the IHS is positioned on the IHS side of the die (or the IHS side of the die is positioned on the die side of the IHS), and a sufficient force can be applied, for example using a spring, to hold the IHS in position during a solder reflow process to bond the IHS and the die into the IHS/die assembly 100 of FIG. 1, according to one embodiment.

Next, for the embodiments, at 214, the IHS/die assembly 100 is put into a suitable heating environment, such as a flow furnace, for solder reflow to bond the IHS to the die.

In one embodiment, for solder TIM comprising tin/bismuth and/or indium/silver alloys, the bonding operation may be performed at temperatures of approximately 155 degrees Celsius to 170 degrees Celsius with a time above liquidus (TAL) of approximately 30 seconds to 90 seconds.

In another embodiment, for solder TIM comprising pure indium, and/or indium/lead/silver alloys, the bonding operation may be performed at temperatures of approximately 170 degrees Celsius to 180 degrees Celsius with a time above liquidus (TAL) of approximately 30 seconds to 90 seconds.

Next, for the embodiments, at 216, the temperature of the IHS/die assembly 100 is ramped down to ambient room temperature. In various embodiments, the temperature is ramped down at a rate lower than about 100 degrees Celsius per minute. In one embodiment, the ramp down rate is approximately 30 degrees Celsius per minute. Once at room temperature, the spring or claim assembly holding the IHS/die assembly together during the bonding process may be removed.

Next, for the embodiments, at 218A, the IHS/die assembly 100 may once more be placed in a suitable furnace to thermally age the bond between the IHS and the die. During the aging process, the material in the die side of the IHS is allowed to react with the material in the solderable TIM to form the bonded intermetallic compound layer having the relatively higher liquidus temperature (compared to the liquidus temperature for forming the intermetallic bond). In one embodiment, where the die side of the IHS comprises copper and the solderable TIM comprises indium, the resulting bonded intermetallic compound layer is CuIn. In an alternate embodiment, where the solderable TIM comprises tin, the resulting intermetallic compound is CuSn.

The thermal aging operation may be performed at temperatures between approximately 150 degrees Celsius to 190 degrees Celsius for approximately 30 minutes to 120 minutes, according to one embodiment.

As an alternate embodiment for 214, 216 and 218A, at 218B the bonding and aging processes for the IHS/die assembly 100 may be combined and performed together. For example, the integrated heat spreader and the die may be heated to a temperature of approximately 150 degrees Celsius to approximately 190 degrees Celsius for a period of time of approximately 30 to 120 minutes to effect the reaction of the compounds creating the intermetallics that bond the IHS to the die.

Next, for the embodiments, at 220, the temperature of the IHS/die assembly 100 is ramped to ambient room temperature at a rate lower than about 100 degrees Celsius per minute. In one embodiment, the ramp down rate is approximately 30 degrees Celsius per minute.

While the aging/reaction/conversion of the materials forming the intermetallic compounds begins in earnest during the time the materials are at liquidus, the formation of the intermetallic compounds continues to proceed even after the TIM has solidified, although at a reduced rate.

Figure 3:
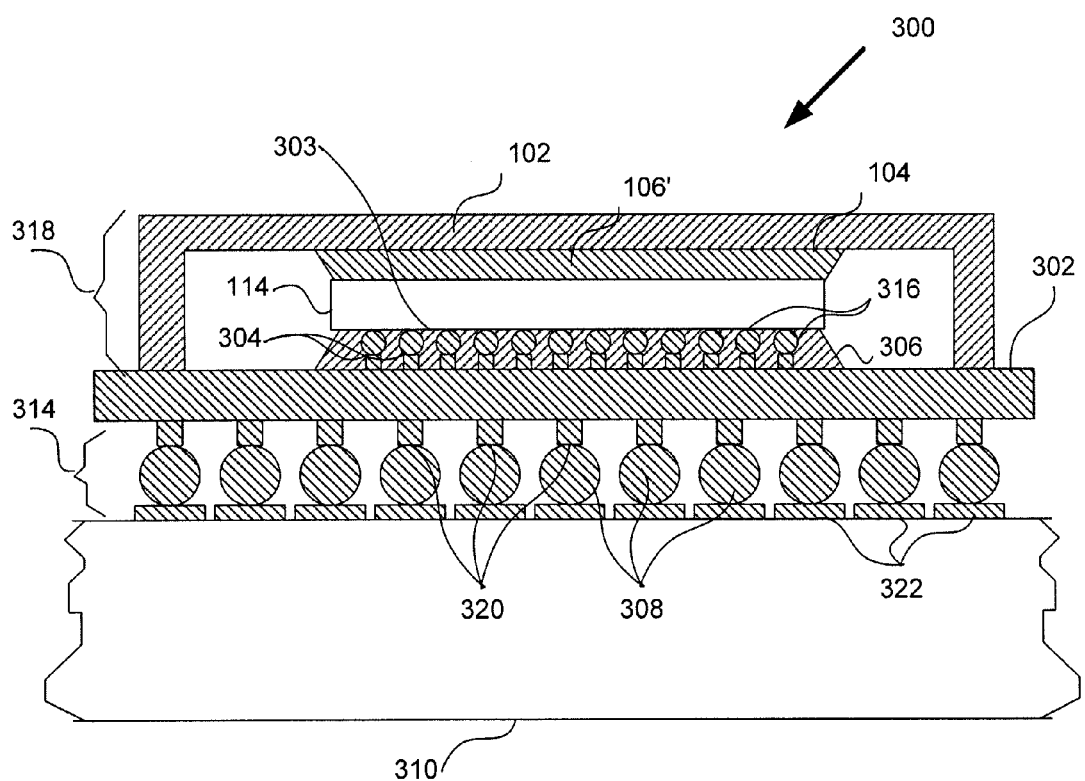
FIG. 3 illustrates a cross-sectional representation of an integrated circuit package, in accordance with one embodiment of the invention.

Next, for the embodiments, at 222A, the IHS/die assembly 100 can be mounted on substrate 302 (as shown in FIG. 3) through any suitable reflow process. Next, for the embodiments, at 224A, an underfill 306 (as shown in FIG. 3) may be introduced (using a capillary fill process or other suitable fill process) to fill the die/substrate gap and then cured. The underfill may comprise an epoxy based compound.

In another embodiment, at 222B, underfill 306 may be applied to the die side of the substrate or the substrate side of the die prior to the mounting of the IHS/die assembly 100 to the substrate 302. Then, at 224B, the IHS/die assembly is mounted onto the substrate and attached through a suitable reflow process.

The operations described above with respect to the methods illustrated in FIG. 2 can be performed in a different order from those described herein. For example, it will be understood by those of ordinary skill that 208 could be carried out prior to 204 or 206, that 218A or 218B may be carried out simultaneously with 222A or 224B.

The above-described choice of materials, geometry, number of layers, temperatures, reflow/thermal aging times, deposition, and assembly can all be varied by one of ordinary skill in the art to optimize the thermal performance of the package, depending on the specific application, and desired operational and reliability characteristics.

Any suitable method, or combination of different methods, for depositing the metal layers and TIM can be used, such as sputtering, vapor, electrical, screening, stenciling, chemical including chemical vapor deposition (CVD), vacuum, and so forth.

The particular implementation of the IC package is flexible in terms of the orientation, size, number, and composition of its constituent elements. Various embodiments of the invention can be implemented using various combinations of substrate technology, IHS technology, thermal interface material, and sealant to achieve the advantages of the present disclosure. The structure, including types of materials used, dimensions, layout, geometry, and so forth, of the IC package can be built in a wide variety of embodiments, depending upon the requirements of the electronic assembly of which it forms a part.

FIG. 3 illustrates a cross-sectional representation of an integrated circuit (IC) package 300, in accordance with one embodiment of the invention. The IC package comprises the IHS/die assembly 100 mounted on an organic land grid array (OLGA) substrate 302 and a lid or integrated head spreader (IHS) 102 of FIG. 1. While an OLGA substrate is shown, as mentioned earlier, embodiments of the present invention are not limited to use with an OLGA substrate and any other type of substrate can be employed. Die 114 can be of any type. In one embodiment, die 114 is a processor. In FIG. 1, die 114 comprises a plurality of signal conductors (not shown) that terminate in pads on a bottom surface 303 (second side) of die 114 (not shown). These pads can be coupled to corresponding lands 304 representing signal, power or ground nodes on OLGA substrate 302 by appropriate connections such as C4 solder bumps 316. A suitable underfill 306, such as an epoxy material, can be used to surround C4 solder bumps 316 to provide mechanical stability and strength. Still referring to FIG. 2, IHS 102 forms a cover over die 114. Prior to mounting the IHS/die assembly 100 to the substrate 302, the IHS 102 is thermally coupled to a surface of die 114 through a suitable solderable thermal interface material 106 (FIG. 1) that has been reacted with the die side of the IHS 102 to create the intermetallic compound 106'. Die 114 can thus dissipate a substantial amount of heat through intermetallic compound 106' to IHS 102. The solderable thermal interface material 106 comprises a material that has a liquidus temperature that is lower than that of the intermetallic compound 106'. Further, the liquidus temperature of the intermetallic compound 106' is higher than that of the solder bumps 316 and solder balls 308. In one embodiment, the wall or support member 318 is located at the periphery of IHS 102. However, in other embodiments IHS 102 can extend beyond the support member 318. For example, a heat spreader of any shape can be formed as part of or attached to IHS 102 in order to increase the rate of heat dissipation from die 114. OLGA substrate 302 can be of any type, including a multi-layer substrate. OLGA substrate 302 can be mounted to an additional substrate 310, such as a printed circuit board (PCB) or card. OLGA substrate 302 can comprise, for example, a plurality of lands 320 that can be mechanically and electrically coupled to corresponding lands 322 of substrate 310 by suitable connectors such as ball grid array (BGA) solder balls 308. While a BGA arrangement 314 is illustrated in FIG. 3 for coupling OLGA substrate 302 to substrate 310, embodiments of the present invention are not limited to use with a BGA arrangement and it can be used with any other type of packaging technology e.g., land grid array (LGA), chip scale package (CSP), or the like. Further, embodiments of the present invention are not to be construed as limited to use in C4 packages and they can be used with any other type of IC package where the herein-described features of the present subject matter provide an advantage.

Figure 4:
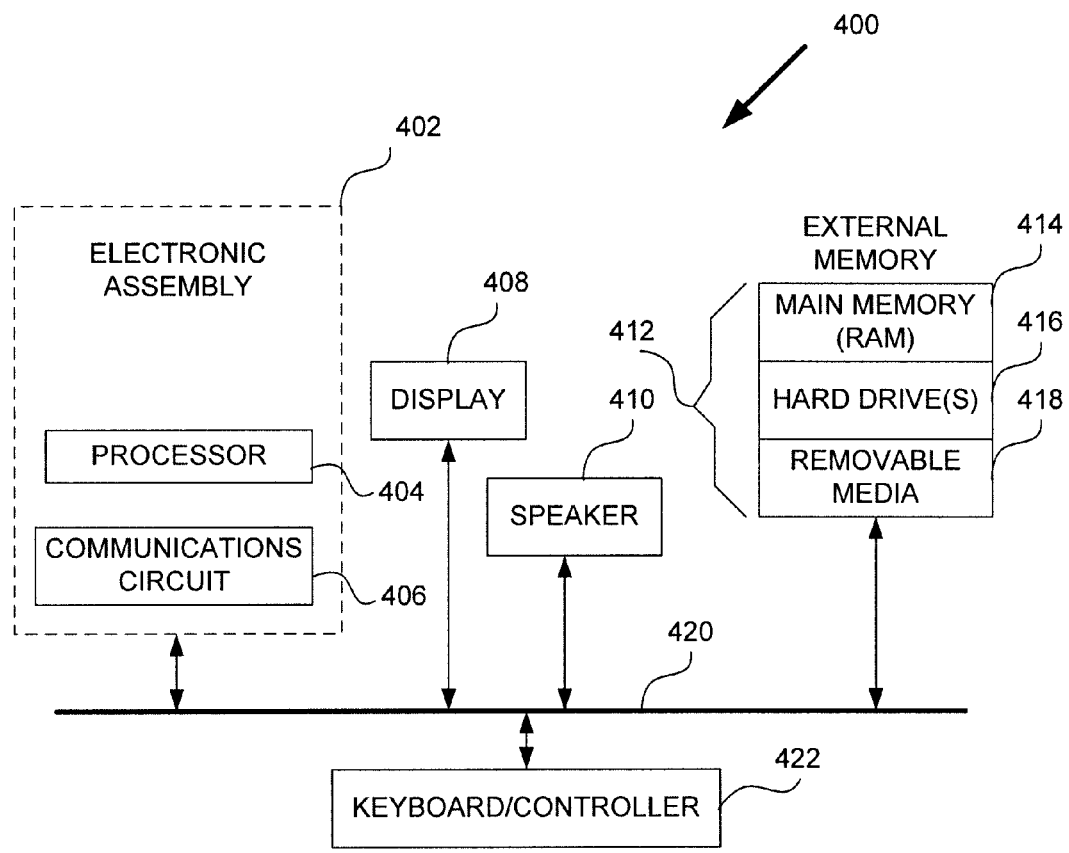
FIG. 4 is a block diagram of an electronic system incorporating at least one electronic assembly with a solderable thermal interface in accordance with one embodiment of the invention.

FIG. 4 illustrates a system 400 incorporating at least one electronic assembly 402 with the IHS/die assembly 100 of FIG. 1 in accordance with one embodiment of the invention. This electronic assembly 402 may have a processor 404 and/or communications circuit 406. The system 400 may further include external memory 412 which in turn can have a main memory 414 in the form of random access memory (RAM), one or more hard drives 416, and/or one or more drives that can use removable media 418, for example, floppy diskettes, compact disks (CDs), digital video disk (DVD), and the like. Additionally, for this example a system bus 420 is used to provide communications links among the various components of the system 400. System bus 420 may be a single bus or a combination of buses. The user interfaces of system 400 may comprise one or more displays 408, one or more speakers 410, and/or a keyboard/controller 420. As earlier stated, one or more of the above-enumerated elements, such as processor 404, may include the IHS/die assembly described above.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. A method comprising:
forming a metallization layer on a die, the metallization layer including an adhesion layer and a diffusion layer, the adhesion layer being disposed between the die and the diffusion layer;
providing an integrated heat spreader having a die side including copper;
forming a thermal interface material between the die side of the integrated heat spreader and the metallization layer;
reacting the thermal interface material with the copper of the integrated heat spreader to form an intermetallic compound layer to couple the integrated heat spreader with the metallization layer, the intermetallic compound comprising an alloy formed from copper and the thermal interface material; and
after coupling the integrated heat spreader with the metallization layer, mounting the die onto a substrate including an organic material having a higher thermal coefficient of expansion relative to a thermal coefficient of expansion of the die.

2. A method comprising:
forming a metallization layer on a die, the metallization layer including an adhesion layer and a diffusion layer, the adhesion layer being disposed between the die and the diffusion layer;
plating a die side of an integrated heat spreader with copper;
forming a thermal interface material between the die side of the integrated heat spreader and the metallization layer; and
reacting the thermal interface material with the copper of the integrated heat spreader to form an intermetallic compound layer to couple the integrated heat spreader with the metallization layer, the intermetallic compound comprising an alloy formed from copper and the thermal interface material.

3. The method of claim 2, wherein the forming of the metallization layer comprises depositing a layer of metal selected from the group consisting of titanium, chromium, zirconium, and vanadium to form the adhesion layer.

4. The method of claim 2, wherein the forming of the metallization layer comprises depositing a layer of metal selected from the group consisting of titanium, chromium, zirconium, nickel, vanadium and gold to form the diffusion layer.

5. The method of claim 2, wherein the forming of the metallization layer further comprises depositing a layer of nickel or gold on the diffusion layer to form a wetting layer.

6. The method of claim 2, wherein the reacting of the thermal interface material comprises thermally bonding the thermal interface material with the die side of the integrated heat spreader.

7. The method of claim 6, wherein the thermally bonding of the thermal interface material with the die side of the integrated heat spreader comprises positioning the integrated heat spreader on the die and applying heat at a first temperature for a first period of time.

8. The method of claim 7, wherein the applying of heat comprises heating the integrated heat spreader and the die to a first temperature between approximately 155 degrees Celsius and approximately 170 degrees Celsius, for a first period of time between approximately 30 seconds and approximately 90 seconds.

9. The method of claim 7, wherein the applying of heat comprises heating the integrated heat spreader and the die to a first temperature between approximately 170 degrees Celsius and approximately 180 degrees Celsius, for a first of time between approximately 30 second and approximately 90 seconds.

10. The method of claim 7, wherein the thermally bonding of the thermal interface material with the die side of the integrated heat spreader further comprises thermal aging by applying heat at a second temperature for a second period of time sufficient to cause the thermal interface layer to react with the die side of the integrated heat spreader to form the intermetallic compound layer.

11. The method of claim 10, wherein the thermal aging by applying heat at the second temperature for the second period of time comprises heating the integrated heat spreader and the die to a temperature of approximately 150 degrees Celsius to approximately 190 degrees Celsius for approximately 30 to 120 minutes.

12. The method of claim 2, wherein the forming of the thermal interface material comprises forming a solder layer comprising one or more alloys of one or more materials selected from the group consisting of tin, bismuth, indium, and silver.

13. The method of claim 2, wherein the reacting of the thermal interface material comprises thermal aging by applying heat at a temperature for a period of time sufficient to cause the thermal interface layer to react with the die side of the integrated heat spreader to form the intermetallic compound layer.

14. The method of claim 13, wherein the thermal aging comprises heating the integrated heat spreader and the die to a temperature between approximately 150 degrees Celsius and approximately 190 degrees Celsius, for a period of time between approximately 30 minutes and approximately 120 minutes.

15. The method of claim 2, wherein the forming of the thermal interface material comprises forming a thermal interface material having a first liquidus temperature on a die side of the thermal interface material, and wherein the reacting of the thermal interface material with the die side of the integrated heat spreader to form the intermetallic compound layer comprises forming an intermetallic compound having a second liquidus temperature, wherein the second liquidus temperature is higher than the first liquidus temperature.

16. The method of claim 2, wherein the integrated heat spreader comprises aluminum silicon carbide (AlSiC).

17. The method of claim 2, wherein the integrated heat spreader comprises graphite.

* * * * *